US012812859B2

(12) United States Patent
Lai et al.

(10) Patent No.: US 12,812,859 B2
(45) Date of Patent: Nov. 24, 2026

(54) FLASH MEMORY STRUCTURE AND METHOD OF FORMING THE SAME

(71) Applicant: Taiwan Semiconductor Manufacturing Co., Ltd., Hsinchu (TW)

(72) Inventors: Sheng-Chih Lai, Hsinchu County (TW); Chung-Te Lin, Tainan City (TW); Yung-Yu Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 20 days.

(21) Appl. No.: 18/524,627

(22) Filed: Nov. 30, 2023

(65) Prior Publication Data

US 2024/0099005 A1 Mar. 21, 2024

Related U.S. Application Data

(60) Continuation of application No. 17/228,072, filed on Apr. 12, 2021, now Pat. No. 11,856,775, which is a (Continued)

(51) Int. Cl.

*H10B 43/20* (2023.01)
*H10B 41/20* (2023.01)

(Continued)

(52) U.S. Cl.

CPC ............ *H10B 43/27* (2023.02); *H10B 43/20* (2023.02); *H10W 20/4441* (2026.01); *H10D 64/037* (2025.01)

(58) Field of Classification Search

CPC ................................ H10B 43/20; H10B 41/20

See application file for complete search history.

(56) References Cited

U.S. PATENT DOCUMENTS

2011/0291177 A1* 12/2011 Lee .................... H10D 30/0413 257/E21.423
2012/0112156 A1* 5/2012 Park ....................... H10B 63/20 257/E45.002

(Continued)

FOREIGN PATENT DOCUMENTS

CN 103730470 A 4/2014
CN 105448928 A 3/2016

(Continued)

OTHER PUBLICATIONS

Lie, L.N. et al., Thermal oxidation of silicides, Journal of Applied Phsyics, vol. 56, No. 7, Oct. 1, 1984, 7 pages.

*Primary Examiner* — Michele Fan

(74) *Attorney, Agent, or Firm* — HAYNES AND BOONE, LLP

(57) ABSTRACT

Memory devices and methods of forming the same are provided. A memory device of the present disclosure includes a bottom dielectric layer, a gate structure extending vertically from the bottom dielectric layer, a stack structure, and a dielectric layer extending between the gate structure and the stack structure. The stack structure includes a first silicide layer, a second silicide layer, an oxide layer extending bet ween the first and second silicide layers, a channel region over the oxide layer and extending between the first and second silicide layers, and an isolation layer over the second silicide layer. The first and second silicide layers include cobalt, titanium, tungsten, or palladium.

20 Claims, 10 Drawing Sheets

Related U.S. Application Data division of application No. 16/509,728, filed on Jul. 12, 2019, now Pat. No. 10,978,473.

(60) Provisional application No. 62/804,599, filed on Feb. 12, 2019.

(51) Int. Cl.

| | |
|---|---|
| ***H10B 43/27*** | (2023.01) |
| ***H10W 20/44*** | (2026.01) |
| *H10D 64/01* | (2025.01) |

(56) References Cited

U.S. PATENT DOCUMENTS

| | | | | |
|---|---|---|---|---|
| 2015/0041873 | A1 | 2/2015 | Karda | |
| 2015/0102280 | A1 | 4/2015 | Lee | |
| 2015/0228663 | A1 | 8/2015 | Youn | |
| 2016/0204117 | A1* | 7/2016 | Liu | H10D 30/0411 257/324 |
| 2017/0178923 | A1 | 6/2017 | Surla | |
| 2019/0027493 | A1 | 1/2019 | Kimura | |
| 2020/0105780 | A1 | 4/2020 | Lai | |
| 2020/0126974 | A1* | 4/2020 | Liu | H10D 62/292 |
| 2020/0266206 | A1 | 8/2020 | Fukuo | |

FOREIGN PATENT DOCUMENTS

| | | | |
|---|---|---|---|
| CN | 105990251 | A | 10/2016 |
| JP | H0897383 | A | 4/1996 |
| KR | 20110003041 | A | 1/2011 |
| KR | 20110060729 | A | 6/2011 |
| TW | 201904027 | A | 1/2019 |
| WO | 2016046602 | A1 | 3/2016 |

* cited by examiner

FLASH MEMORY STRUCTURE AND METHOD OF FORMING THE SAME

PRIORITY

This is a continuation application of U.S. patent application Ser. No. 17/228,072, filed Apr. 12, 2021, which is a divisional application of U.S. patent application Ser. No. 16/509,728, filed Jul. 12, 2019, which claims benefit of and is related to Provisional Application Ser. No. 62/804,599, filed Feb. 12, 2019, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Flash memory devices, for example, have evolved to include three-dimensional (3D) stackable structures that are formed from a film stack. Tungsten has been used in such film stack due to its ability to accommodate high thermal budget. Because tungsten can be oxidized at high process temperatures, the use of tungsten in the film stacks necessitates various barrier layers and protection layers to protect the tungsten layers from oxidation. The implementation of the various barrier layers and the protection layers, while being an adequate solution to the oxidation of the tungsten layers, increases the complexity of the film stack and the process flows for forming flash devices. Therefore, although conventional semiconductor devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A~10A are various cross-sectional diagrammatic view of the stack structure in FIG. 1 at various stages of fabrication of the method in FIG. 3, according to some embodiments of the present disclosure.

FIGS. 4B~10B are various cross-sectional diagrammatic view of the stack structure in FIG. 2 at various stages of fabrication of the method in FIG. 3, according to some embodiments of the present disclosure.

DETAILED DESCRIPTION

Figure 1:
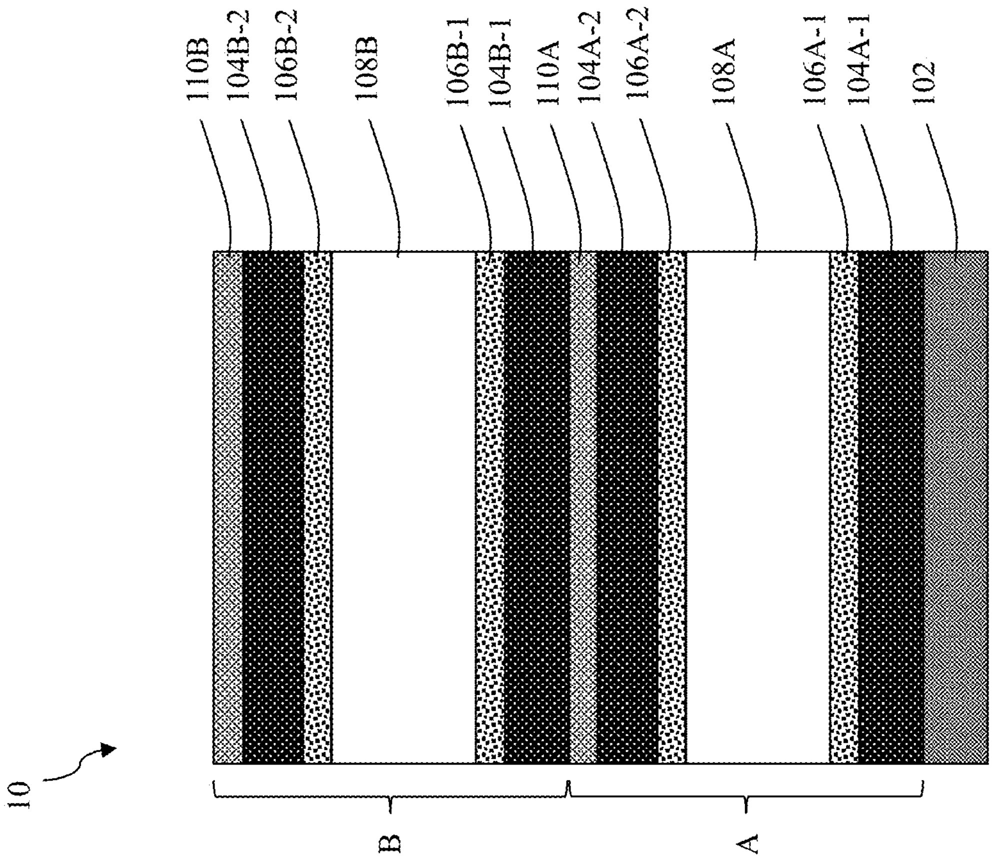
FIG. 1 is a cross-sectional diagrammatic view of a stack structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to memory devices and 3D memory structures, such as those for NOR flash applications. In some conventional memory structures, tungsten (W) metal layer is used in memory film stacks to reduce resistance loading of source line (SL) and bit line (BL) and to pass the subsequent high thermal budget (~800 C) for the formation of the oxide-nitride-oxide (ONO, silicon oxide/silicon nitride/silicon oxide) layers. When the tungsten metal layer is used, the tungsten metal line may be exposed to oxygen-containing process for $SiO_2$ formation, which may cause the tungsten metal line failure due to oxidation. To prevent oxidation of the tungsten metal lines, a barrier layer, such as a titanium nitride layer, is deposited to enclose the tungsten metal lines. In addition, when the tungsten metal line and barrier layers are used, a polysilicon sidewall protection layer is needed. Further, to make room for the polysilicon sidewall protection layer, a recess process for the barrier layer is necessary. Thus, the use of the tungsten metal line would require additional barrier layers (such as TiN or TaN), additional W/barrier metal recess process for sidewall protection layer, and polysilicon sidewall protection layers, thereby leading to increased process complexity.

The present disclosure provides a memory device that is formed from a stack structure that includes metal silicides that have conductivity and an allowed thermal budget (or thermal budget tolerance) comparable to those of tungsten. However, compared to tungsten, oxidation of the metal silicides are self-limiting, which makes the metal silicides less reactive to oxygen at high temperature (~800° C.). For that reason, no barrier layers and protection layers are needed to protect the metal silicides from oxidation. By replacing the tungsten layers with the metal silicide layers, the stack structure according to the present disclosure has a simpler structure that can be fabricated using less complicated processes, resulting in improved process robustness and yield.

Referring now to FIG. 1, a cross-sectional diagrammatic view of a stack structure 10 according to some embodiments of the present disclosure is illustrated. The stack structure 10 may serve as a basic structure for formation of a memory device, such as a three-dimensional (3D) stackable memory structure. In some embodiments, the stack structure 10 includes an even number of film stacks, such as 2, 4, 8, 16, 24, and 32 film stacks. For ease of illustration, only two film stacks, a first film stack A and a second film stack B, of the stack structure 10 are illustrated. Each of the film stack serves as a base for field effect transistors (FETs). In some embodiments, the memory device to be formed of the stack structure 10 or the alternative stack structure 11 may include N-type or P-type FETs. In some examples, the memory device may include N-type FETs. When the stack structure 10 includes more film stacks, additional film stacks may be formed over the second film stack B in FIG. 1. In some embodiments, the stack structure 10 is formed on a bottom dielectric layer 102. In some embodiments, the bottom dielectric layer 102 may be formed over a substrate or an interconnect structure. In some instances, the bottom dielectric layer 102 may be formed of a suitable dielectric material, such as zirconium oxide, aluminum oxide, aluminum nitride, silicon carbide, and silicon nitride. When silicon nitride or silicon carbide is used for the bottom dielectric layer 102, it may be doped with carbon or nitrogen to impart different etching selectivity. In one embodiment, the first film stack A includes a first silicide layer 104A-1 over the bottom dielectric layer 102, a first polycrystalline semiconductor layer 106A-1 over the first silicide layer 104A-1, a first oxide layer 108A over the first polycrystalline semiconductor layer 106A-1, a second polycrystalline semiconductor layer 106A-2 over the first oxide layer 108A, a second silicide layer 104A-2 over the second polycrystalline semiconductor layer 106A-2, and a first isolation layer 110A over the second silicide layer 104A-2. In some implementations, the first and second silicide layers 104A-1 and 104A-2 include a metal silicide that has conductivity and an allowed thermal budget (or thermal budget tolerance) comparable to those of tungsten. In some instances, the metal silicide may be titanium silicide ($TiSi_2$), cobalt silicide ($CoSi_2$, C54 phase), tungsten silicide (WSi), palladium silicide (PdSi), other suitable silicide, or a combination thereof. The first and second polycrystalline semiconductor layers 106A-1 and 106A-2 include polycrystalline silicon that may be doped or undoped. When the first and second polycrystalline semiconductor layers 106A-1 and 106A-2 are doped, they may be doped an N-type dopant, such as phosphorous or arsenic, or a P-type dopant. In some implementations, the first oxide layer 108A may be semiconductor oxide, such as silicon oxide. In some embodiments, the first isolation layer 110A may be formed of a dielectric material that is different from the dielectric material forming the bottom dielectric layer 102. In some instances, the first isolation layer 110A may be formed of silicon nitride, which may be doped with carbon or oxygen to impart different etching selectivity In some embodiments, layers within the stack structures, such as those within the first and second film stacks A and B, may be deposited using chemical vapor deposition (CVD), physical vapor deposition (PVD), atomic layer deposition (ALD), or other suitable deposition techniques. As described above, about 2 to 32 identical film stacks may be formed over the bottom dielectric layer 102. For example, as illustrated in FIG. 1, the second film stack B, which is identical to the first film stack A, is formed over the first film stack A. The second film stack B includes a third silicide layer 104B-1 over the first isolation layer 110A, a third polycrystalline semiconductor layer 106B-1 over the third silicide layer 104B-1, a second oxide layer 108B over the third polycrystalline semiconductor layer 106B-1, a fourth polycrystalline semiconductor layer 106B-2 over the second oxide layer 108B, a fourth silicide layer 104B-2 over the fourth polycrystalline semiconductor layer 106B-2, and an second isolation layer 110B over the fourth silicide layer 104B-2. While the second isolation layer 110B is illustrated as the topmost layer of the stack structure 10 in FIG. 1, such illustration is merely for illustration purposes and the stack structure 10 may include additional film stacks over the second isolation layer 110B. In some examples, the topmost isolation layer of the stack structure 10 is formed to a thickness greater than thickness of the other isolation layers such that the topmost isolation layer can withstand the RIE processes in the processes to form memory devices.

Figure 2:
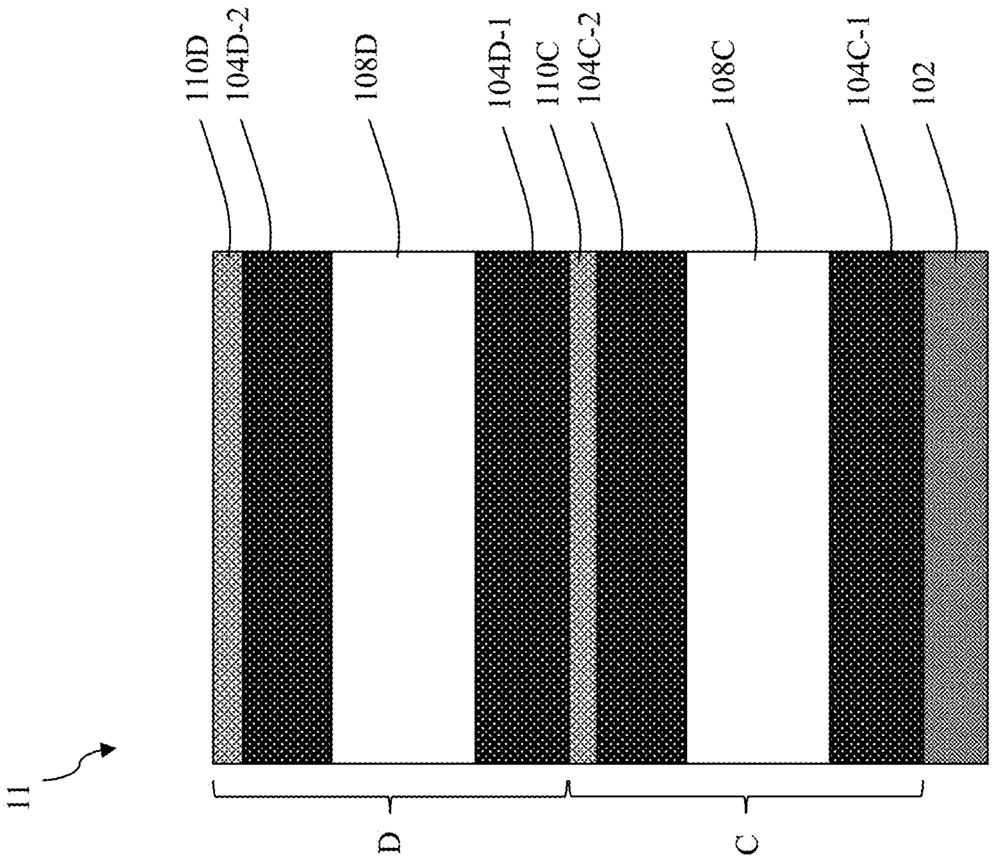
FIG. 2 is a cross-sectional diagrammatic view of an alternative stack structure according to some embodiments of the present disclosure.

Referring now to FIG. 2, a cross-sectional diagrammatic view of an alternative stack structure 11 according to some embodiments of the present disclosure is illustrated. The alternative stack structure 11 is different from the stack structure 10 in that the alternative stack structure 11 does not include any polycrystalline semiconductor layers, such as the first, second, third, and fourth polycrystalline semiconductor layers 106A-1, 106A-2, 106B-1, and 106B-2 in the stack structure 10. The omission of the polycrystalline semiconductor layers may increase the Schottky barrier height between the silicide layers and the polycrystalline semiconductor channels and for that reasons, the memory device to be formed from the alternative stack structure 11 may have a read/write drive scheme different from that of the memory device to be formed from the stack structure 10 In some embodiments, the alternative stack structure 11 also includes an even number of film stacks, such as 2, 4, 8, 16, 24, and 32 film stacks. For ease of illustration, only two film stacks, a third film stack C and a fourth film stack C, of the alternative stack structure 11 are illustrated. Each of the film stacks will be formed into FETs. When the alternative stack structure 11 includes more film stacks, additional film stacks may be formed over the fourth film stack D in FIG. 2. In some embodiments, the alternative stack structure 11 is formed on a bottom dielectric layer 102. In some embodiments, the bottom dielectric layer 102 may be formed over a substrate or an interconnect structure and may be formed of a dielectric material, such as zirconium oxide, aluminum oxide, aluminum nitride, silicon carbide, and silicon nitride. When silicon nitride or silicon carbide is used for the bottom dielectric layer 102, it may be doped with carbon or nitrogen to impart different etching selectivity. In one embodiment, the third film stack C includes a fifth silicide layer 104C-1 over the bottom dielectric layer 102, a third oxide layer 108C over the fifth silicide layer 104C-1, a sixth silicide layer 104C-2 over the third oxide layer 108C, and a third isolation layer 110C over the sixth silicide layer 104C-2. In some implementations, the fifth and sixth silicide layers 104C-1 and 104C-2 include a metal silicide that has a conductivity and an allowed thermal budget (or thermal budget tolerance) comparable to those of the tungsten. In some instances, the metal silicide may be titanium silicide ($TiSi_2$), cobalt silicide ($CoSi_2$, C54 phase), tungsten silicide (WSi), palladium silicide (PdSi), other suitable silicide, or a combination thereof. In some implementations, the third oxide layer 108C may be semiconductor oxide, such as silicon oxide. In some embodiments, the third isolation layer 110C may be formed of a dielectric material that is different from the dielectric material forming the bottom dielectric layer 102. In some instances, the third isolation layer 110C may be formed of silicon nitride, which may be doped with carbon or oxygen to impart different etching selectivity.

In some embodiments, layers within the stack structures, such as those within the fifth and sixth film stacks C and D, may be deposited using CVD, PVD, ALD, or other suitable deposition techniques. As described above, about 2 to 32 identical film stacks may be formed over the bottom dielectric layer 102. For example, as illustrated in FIG. 2, the fourth film stack D, which is identical to the third film stack C, is formed over the third film stack C. The fourth film stack D includes a seventh silicide layer 104D-1 over the third isolation layer 110C, a fourth oxide layer 108D over the seventh silicide layer 104D-1, and an eighth silicide layer 104D-2 over the fourth oxide layer 108D, and a fourth isolation layer 110D over the eighth silicide layer 104D-2. While the fourth isolation layer 110D is illustrated as the topmost layer of the alternative stack structure 11 in FIG. 2, such illustration is merely for illustration purposes and the alternative stack structure 11 may include additional film stacks over the fourth isolation layer 110D. In some examples, the topmost isolation layer of the alternative stack structure 11 is formed to a thickness greater than thickness of the other isolation layers such that the topmost isolation layer can withstand the RIE processes in the processes to form memory devices.

Compared to tungsten, metal silicide for the first, second, third, fourth, fifth, sixth, seventh, and eighth may have resistivity and an allowed thermal budget (or thermal budget tolerance) comparable to those of tungsten while having low oxidation rate. Tungsten has a resistivity about 1030 μΩ-cm and an allowed thermal budget (or thermal budget tolerance) between about 750° C. and about 900° C. Titanium silicide, for example, has a resistivity about 1015 μΩ-cm and an allowed thermal budget between about 800° C. and about 900° C. Cobalt silicide ($CoSi_2$, C54 phase), for example, has a resistivity about 18-20 μΩ-cm and an allowed thermal budget between about 750° C. and about 850° C. It is observed that oxidation of metal silicides, such as titanium silicide ($TiSi_2$) and cobalt silicide ($CoSi_2$, C54 phase), at 800° C. is self-limiting. That is, after a thin oxide film is formed at the interface between the metal silicide and the source of oxygen, the oxidation rate of the metal silicide may substantially decrease. The oxidation of tungsten, however, is not self-limiting and the oxidation may continue until a substantial portion of the tungsten layer is oxidized. For that reason, metal silicides exhibit slower oxidation rates than tungsten. When tungsten is used in conventional stack structures, a barrier layer, such as one formed of metal nitride (such as titanium nitride or tantalum nitride), has to be formed between the tungsten layer and the bottom dielectric layer and between the tungsten layer and the oxide layer to protect the tungsten from being oxidized. Additionally, to prevent sidewalls of the tungsten layers from being oxidized, the tungsten layers and the barrier layers also have to be recessed to accommodate polysilicon sidewall protection layers. The implementation of the barrier layers, the recess of the tungsten layers, and the formation of the polysilicon sidewall protection layers may complicate the process, reduce process robustness, and lower yield. The present disclosure provides stack structures that are free from tungsten layer as well as the accompanying barrier layers and sidewall protection layers, thereby reducing process complexity and increasing process robustness and yield.

Figure 3:
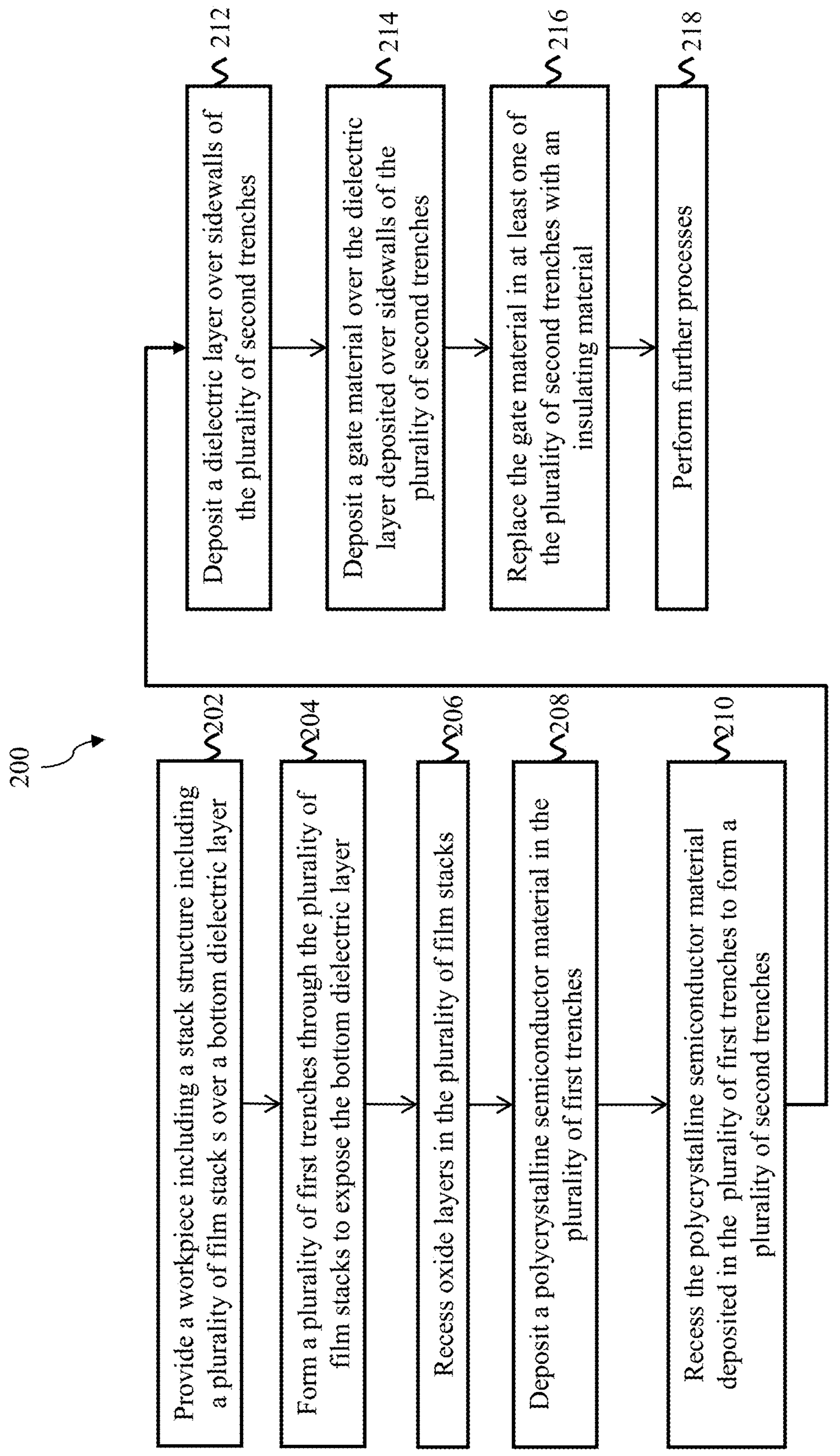
FIG. 3 is a flowchart of method for forming a memory device, according to some embodiments of the present disclosure.

FIG. 3 illustrates a flow chart of a method 200 for fabricating a semiconductor device, such as a memory device, on a workpiece. At block 202 of the method 200, a workpiece is provided. The workpiece includes a stack structure that includes a plurality of film stacks over a bottom dielectric layer. At block 204 of the method 200, a plurality of first trenches through the stack structure is formed to expose the bottom dielectric layer. At block 206 of the method 200, oxide layers in the plurality of stack structures are recessed. At block 208 of the method 200, a polycrystalline semiconductor material is deposited in the plurality of first trenches. At block 210 of the method 200, the polycrystalline semiconductor material deposited in the plurality of first trenches is recessed to form a plurality of second trenches. At block 212 of the method 200, dielectric layers are deposited over sidewalls of the plurality of second trenches. At block 214 of the method 200, a gate material is deposited over the dielectric layers deposited over sidewalls of the plurality of second trenches. At block 216 of the method 200, vertical isolation features are formed. At block 218 of the method 200, further processes may be performed to complete fabrication of the semiconductor device. Additional steps can be provided before, during, and after the method 200, and some of the steps described can be replaced or eliminated for other embodiments of the method 200.

Figure 4B:
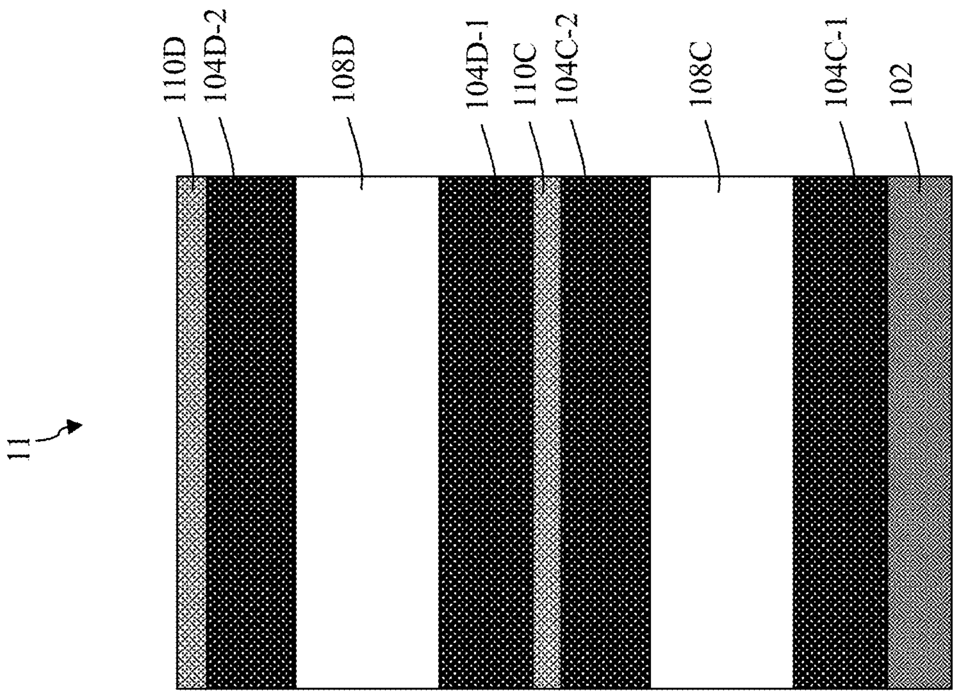
Figure 4A:
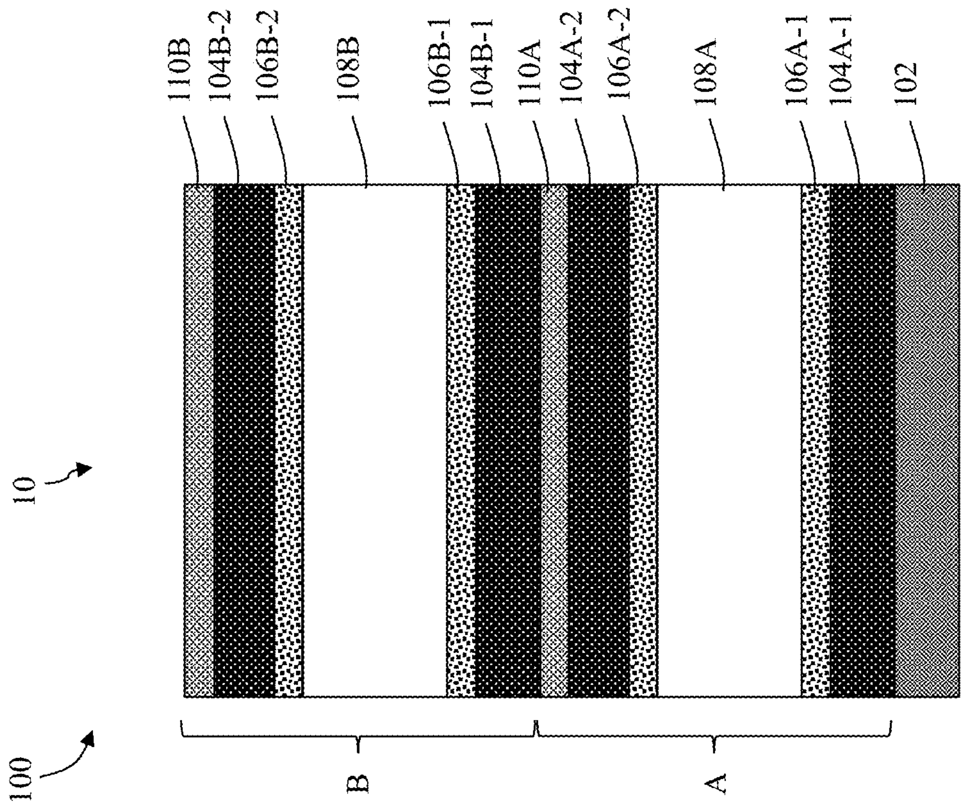

Referring now to FIGS. 3, 4A and 4B, the method 200 includes a block 202 where a workpiece 100. The workpiece 100 may include a stack structure such as one similar to the stack structure 10 in FIG. 1 or one similar to the alternative stack structure 11. FIGS. 4A-10A illustrate the operations of the method 200 when the workpiece 100 includes a stack structure similar to the stack structure 10 in FIG. 1 and FIGS. 4B-10B illustrate the operations of the method 200 when the workpiece 100 includes a stack structure similar to the alternative stack structure 11 in FIG. 2. The stack structure 10 includes an even number of film stacks, such as 2, 4, 8, 16, 24, and 32 film stacks. Only two film stacks, the first film stack A and the second film stack B, are illustrated in FIGS. 4A-10A. Similarly, the alternative stack structure 11 includes an even number film stacks, such as 2, 4, 8, 16, 24, and 32 film stacks. Only two film stacks, the first film stack C and the second film stack D, are illustrated in FIGS. 4B-10B. The details of film stacks in the stack structure 10 and the alternative stack structure 11 have been described above and will not be repeated. It is noted that, unless otherwise specified, the reference numerals A, B, C, D do not in any way suggest a necessary order of stacking.

Figure 5B:
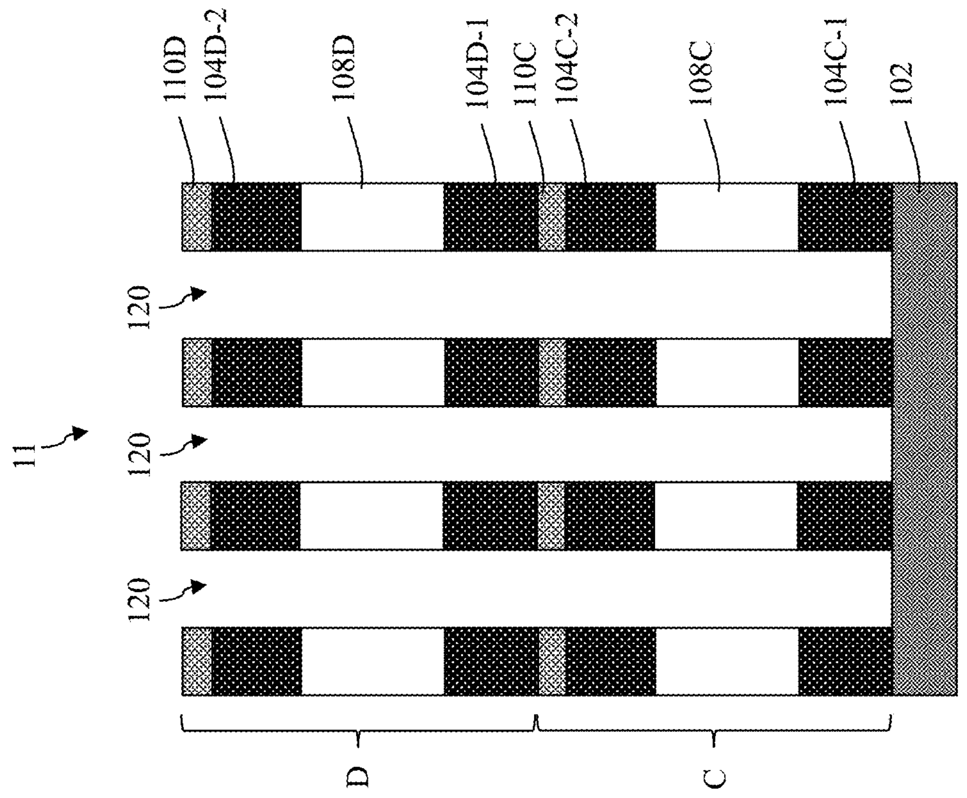
Figure 5A:
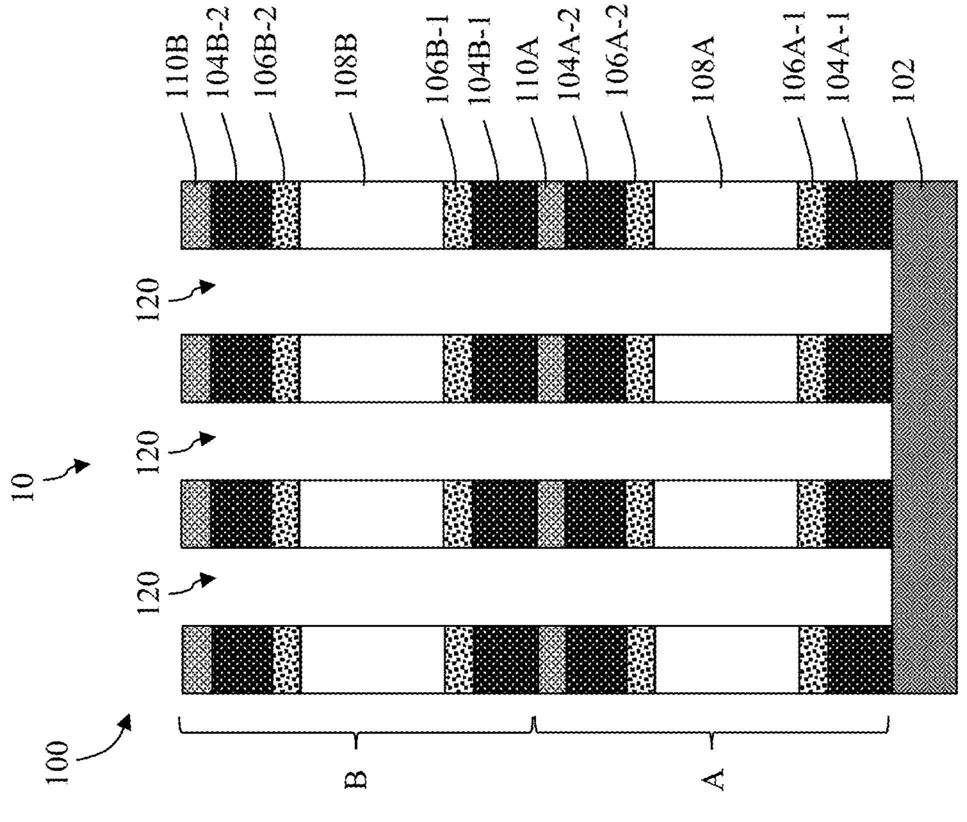

Referring now to FIGS. 3, 5A and 5B, the method 200 includes a block 204 where a plurality of first trenches 120 is formed through the plurality of film stacks of the stack structure 10 or the alternative stack structure 11 to expose the bottom dielectric layer 102. In some embodiments, each of the plurality of first trenches 120 may have a high aspect ratio (depth/width) between about 5 and about 25 for two-film-stack stack structures shown in FIGS. 5A and 5B and may be between about 5 and about 100 when the stack structures include more film stacks. In some examples, each of the plurality of first trenches 120 may have a depth between about 400 nm and 1 μm and a width between about 40 nm and about 80 nm. In some implementations, the plurality of first trenches may be formed by reactive ion etching (RIE) until the bottom dielectric layer 102 is exposed. In some instances, the plurality of film stacks of the stack structure 10 or the alternative stack structure 11 is selectively etched while the bottom dielectric layer 102 is substantially unetched. As described above, the material of the bottom dielectric layer 102 and the material of the isolation layers (such as the first, second, third, and fourth isolation layers 110A, 110B, 110C, and 110D) are different such that the isolation layers can be etched while the bottom dielectric layer 102 is substantially unetched. In this regard, the bottom dielectric layer 102 serves both as an etch stop layer for the formation of the plurality of first trenches 120. While not shown, each of the plurality of first trenches 120 may have a rectangular cross section when viewed from a direction perpendicular to the bottom dielectric layer 102.

Figure 6B:
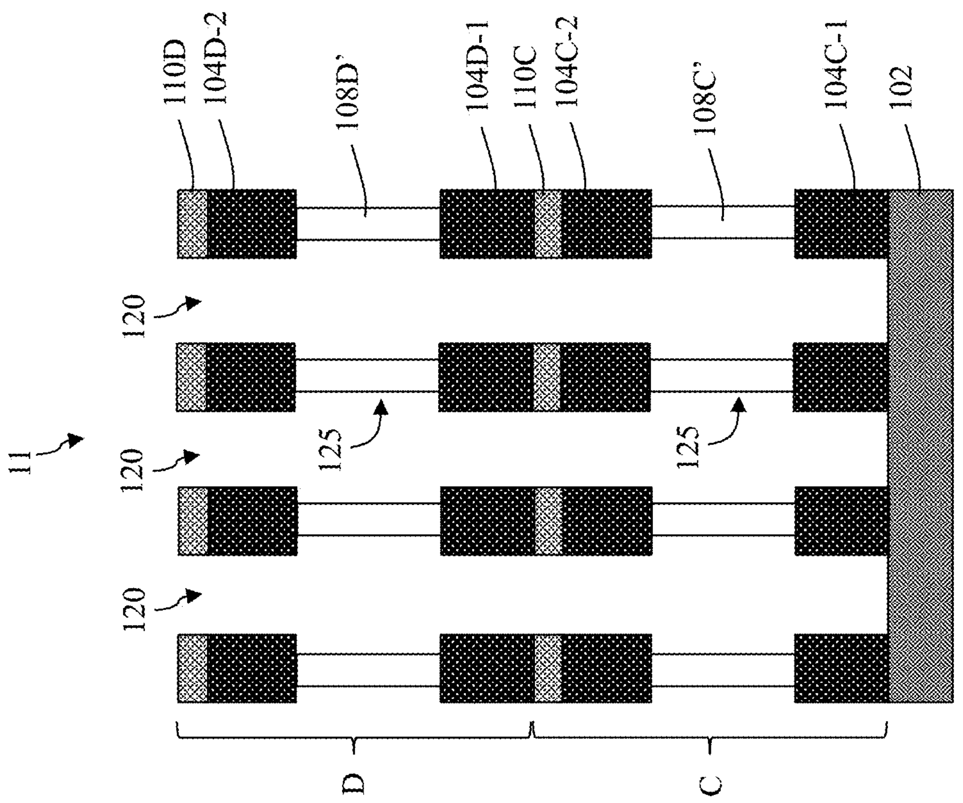
Figure 6A:
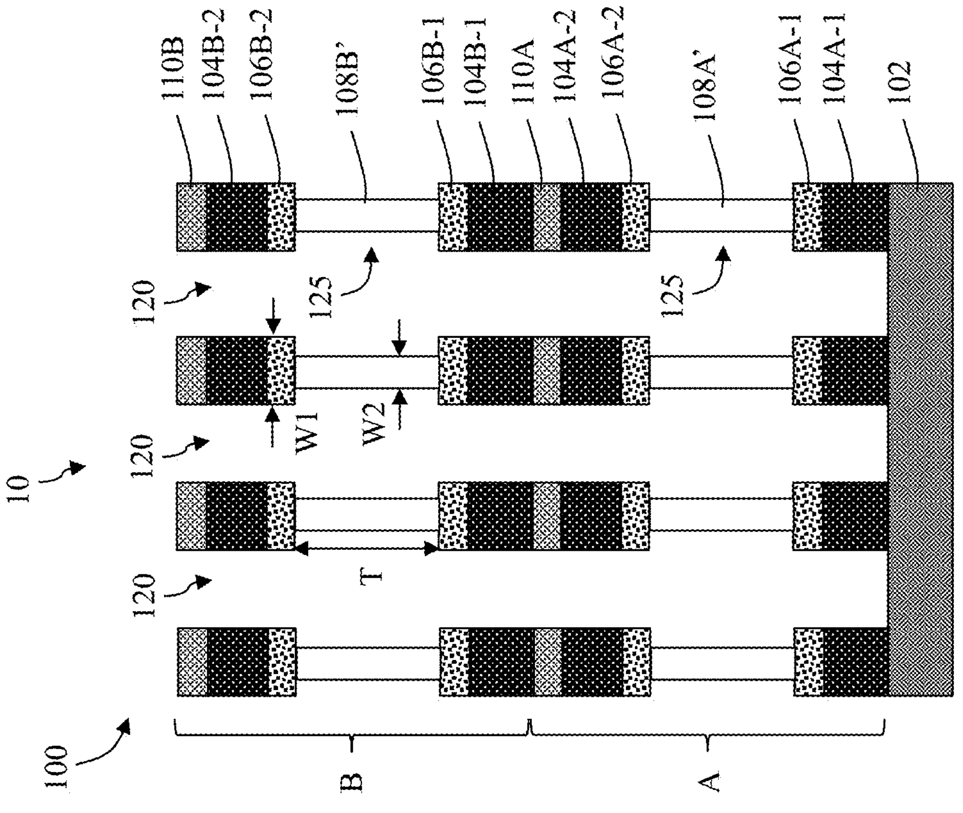

Referring now to FIGS. 3, 6A and 6B, the method 200 includes a block 206 where the oxide layers in the plurality of film stacks, such as the first oxide layer 108A, the second oxide layer 108B, the third oxide layer 108C, and the fourth oxide layer 108D are recessed to have recesses 125. In some embodiments, the oxide layers may be selectively etched using dry etch, wet etch, a combination thereof, or other suitable etch techniques. In these embodiments, the silicide layers (104A-1, 104A-2, 104B-1, 104B-2, 104C-1, 104C-2, 104D-1, and 104D-2), the polycrystalline semiconductor layers (106A-1, 106A-2, 106B-1, and 106B-2), and the isolation layers (such as the first, second, third, and fourth isolation layers 110A, 110B, 110C, and 110D) are substantially unetched while the oxide layers (such as the first, second, third, and fourth oxide layers 108A, 108B, 108C, and 108D) are etched such that their widths are reduced from W1 to W2. W2 is the width of each of the recessed oxide layers (such as the first, second, third, and fourth recessed oxide layers 108A', 108B', 108C', and 108D'). Each of the recesses may be defined by the difference between W1 and W1 as well as the thickness T of the oxide layers.

Figure 7B:
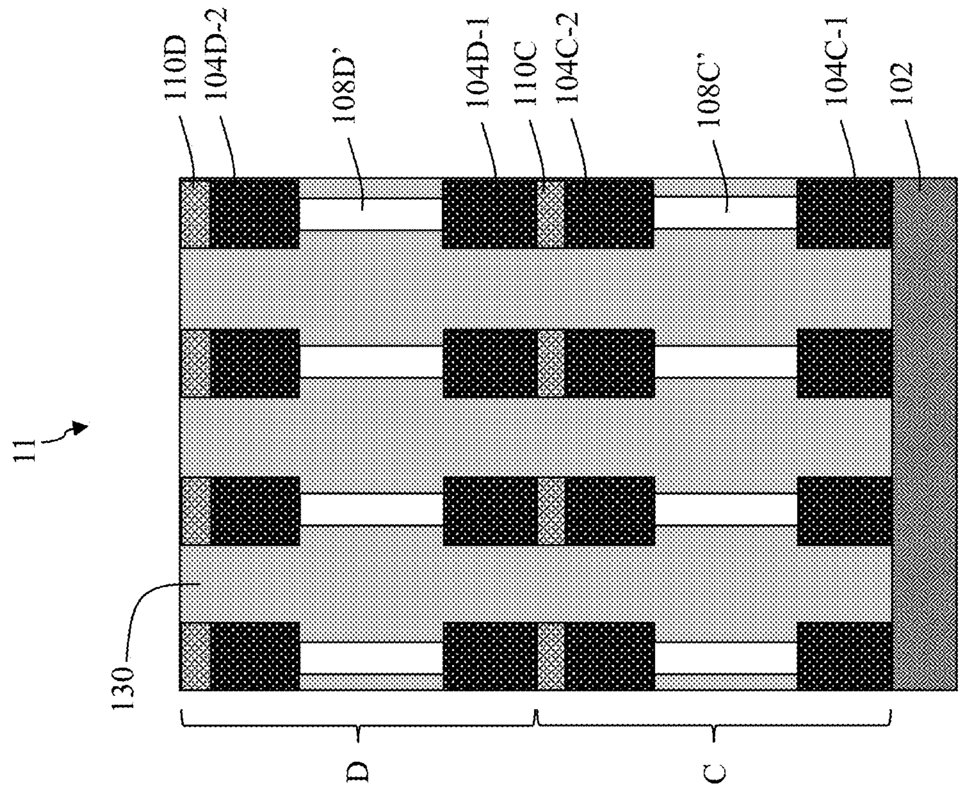
Figure 7A:
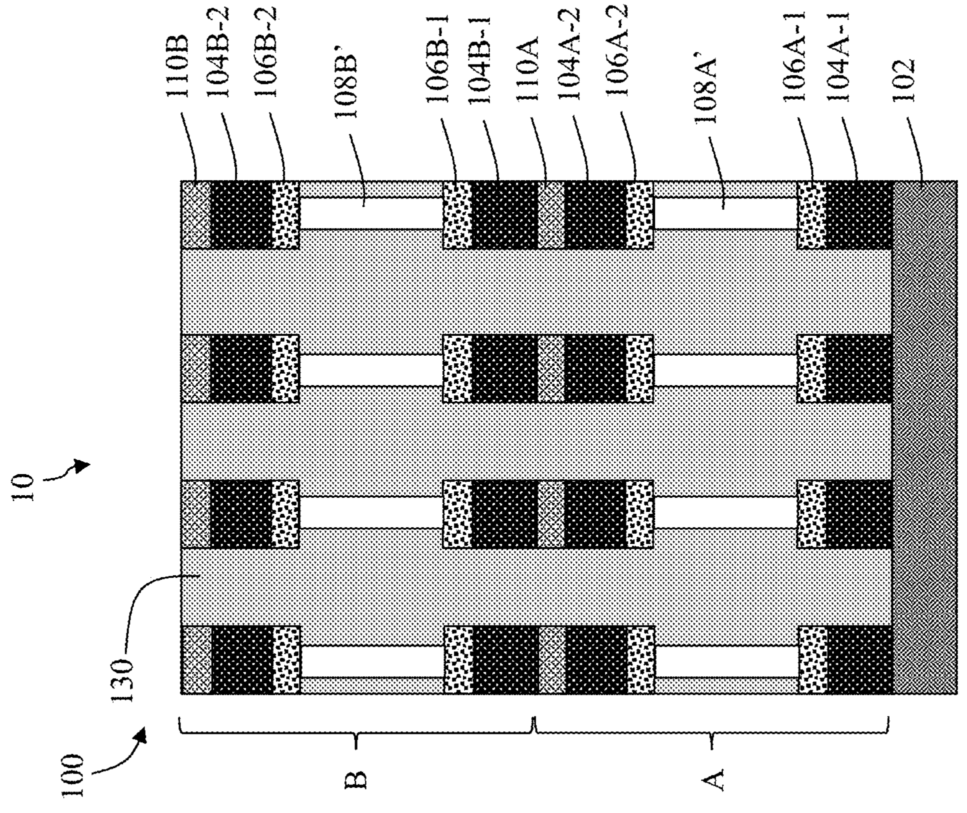

Referring now to FIGS. 3, 7A and 7B, the method 200 includes a block 208 where a polycrystalline semiconductor material 130 is deposited in the plurality of first trenches 120. In some embodiments, the polycrystalline semiconductor material 130 may be deposited over the workpiece 100 to fill in the plurality of first trenches 120 as well as the recesses 125 using CVD, ALD, or other suitable deposition techniques that have good hole filling capability. In some instances, the polycrystalline semiconductor material 130 is first deposited using ALD to fill in the recesses 125 and then deposited using CVD to increase throughput. In some implementations, the polycrystalline semiconductor material 130 may be polycrystalline silicon that may be undoped or lightly doped. In some examples, the polycrystalline semiconductor material 130 is lightly doped with a P-type dopant, such as boron. In some embodiments, after the polycrystalline semiconductor material 130 is deposited at block 208, a planarization process, such as a chemical mechanical polishing (CMP) process, may be performed to provide a planar top surface for upcoming processes.

Figure 8B:
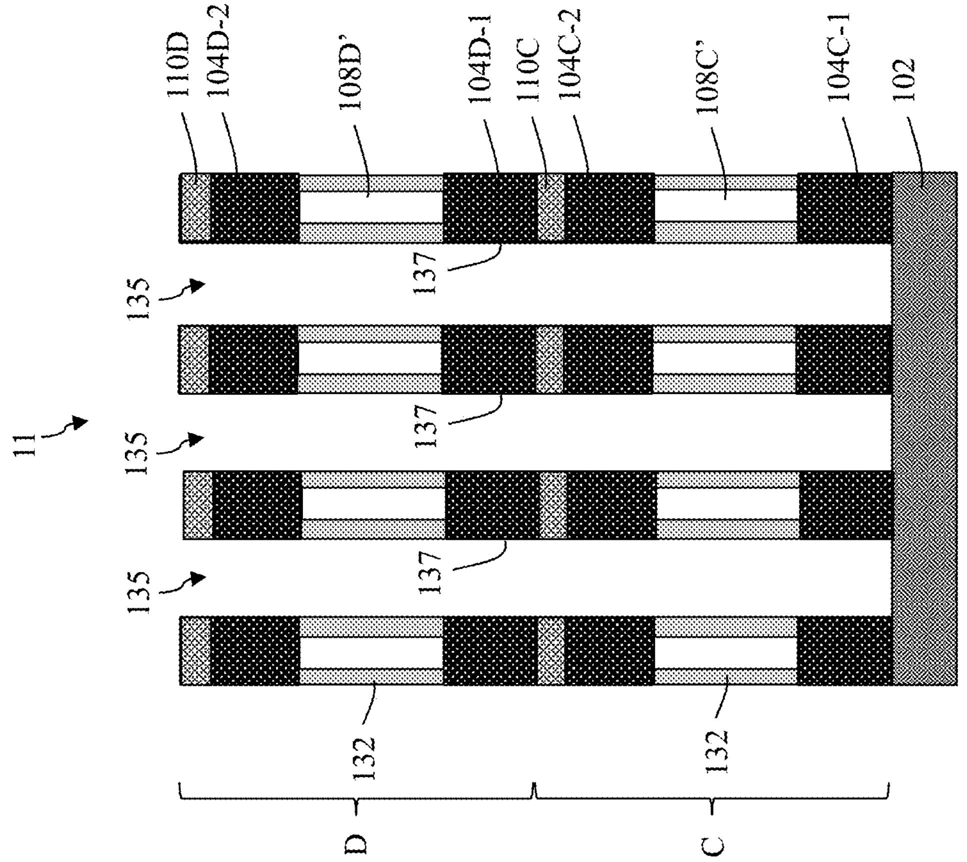
Figure 8A:
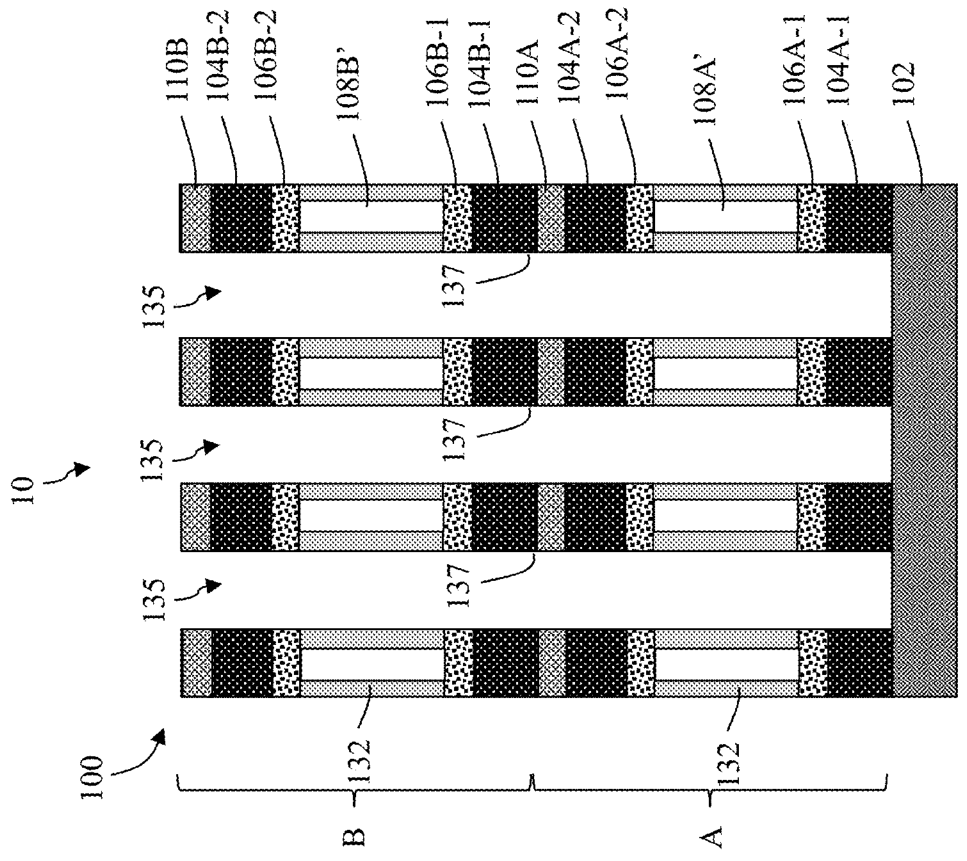

Referring now to FIGS. 3, 8A and 8B, the method 200 includes a block 210 where the polycrystalline semiconductor material 130 deposited in the plurality of first trenches 120 is recessed to form a plurality of second trenches 135. In some embodiments, the polycrystalline semiconductor material 130 deposited at block 208 is anisotropically etched using directionally etching techniques, such as RIE. In some implementations, because the recesses 125 that can shield the deposited polycrystalline semiconductor material 130 from the anisotropic etch at block 210, the recesses 125 are filled with the polycrystalline semiconductor material 130 after the plurality of second trenches 135 are formed. The polycrystalline semiconductor material 130 deposited in the recesses 125 will serve as the channel regions of the memory device to be formed on the workpiece 100 and may be referred to as channel features 132. In embodiments represented in FIGS. 8A and 8B, each of the channel features 132 is formed on sidewalls of a recessed oxide layer, such as the first recessed oxide layer 108A', the second recessed oxide layer 108B', the third recessed oxide layer 108C', and the fourth recessed oxide layer 108D'. In addition, as shown in FIGS. 8A and 8B, in some instances, each of the plurality of first trenches 120 may have substantially the same dimensions as each of the plurality of second trenches 135. Each of the plurality of second trenches 135 is defined by two sidewalls 137 and a bottom surface on the bottom dielectric layer 102. It is noted that block 210 of the method 200 removes polycrystalline semiconductor material 130 on sidewalls of the isolation layers (such as the first, second, third, and fourth isolation layers 110A, 110B, 110C, and 110D) to prevent shorts or device failures.

Figure 9B:
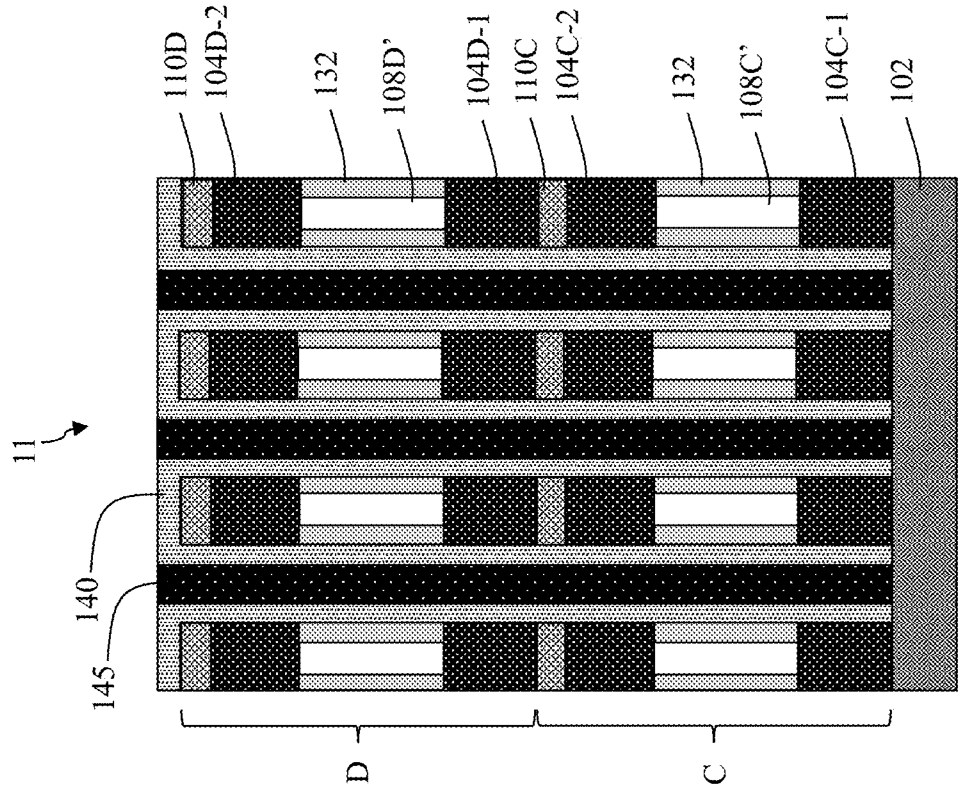
Figure 9A:
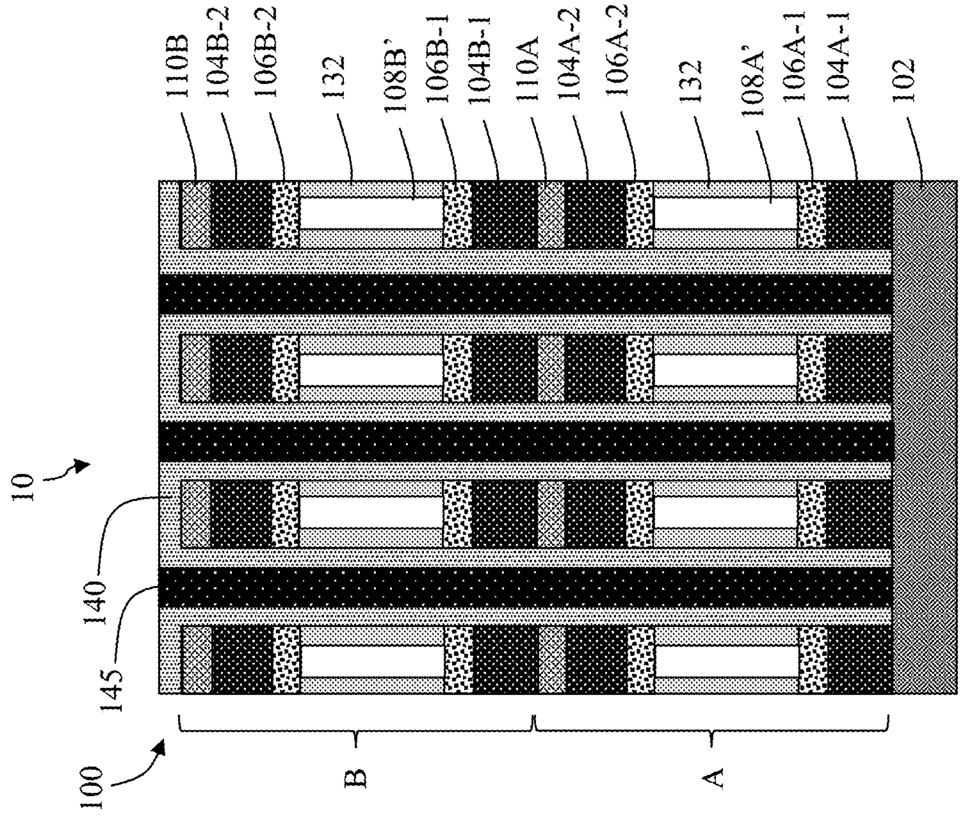

Referring now to FIGS. 3, 9A and 9B, the method 200 includes a block 212 where a dielectric layer 140 is deposited over sidewalls 137 of the plurality of second trenches 135. In some embodiments, the dielectric layer 140 may include multiple layers of different dielectric materials. In some instances, the dielectric layer 140 includes a semiconductor nitride layer sandwiched between two semiconductor oxide layers and may be referred to as an ONO layer. In those instances, the semiconductor nitride layer may be a silicon nitride ($Si_xN_y$) layer and the semiconductor oxide layer may be a silicon oxide layer. The dielectric layer 140 may also be referred to as a storage layer because it functions to trap charges and the current differences detected in the cell (e.g., drain current) provide the memory effect. The ratio of Si to N in the silicon nitride layer in the ONO layer may be used to tune the performance of the storage layer. In some implementations, the semiconductor oxide layer in the dielectric layer 140 may be formed using deposition techniques with good step coverage, such as low pressure chemical vapor deposition (LPCVD), low pressure atomic layer deposition (LPCVD) at a temperature between about 750° C. and about 850° C., to ensure good film quality. The semiconductor nitride layer in the dielectric layer 140 may be formed using deposition techniques with good step coverage, such as low pressure chemical vapor deposition (LPCVD), low pressure atomic layer deposition (LPALD) at a temperature between about 650° C. and about 700° C. In embodiments represented in FIGS. 9A and 9B, the deposition of the dielectric layer 140 does not completely fill the plurality of second trenches and leaves a vertical opening for the gate material 145, to be described below. In some implementations, the high temperature during the formation of the dielectric layer 140 at block 212 may facilitate phase transition or recrystallization of the silicide layers (such as the first, second, third, fourth, fifth, sixth, seventh, and eighth silicide layers 104A-1, 104A-2, 104B-1, 104B-2, 104C-1, 104C-2, 104D-1, and 104D-2) into a phase with a conductivity comparable to that of tungsten. For example, the high temperature at block 212 may facilitate titanium silicide to transition into the C54 phase.

Referring now to FIGS. 3, 9A and 9B, the method 200 includes a block 214 where a gate material 145 is deposited over the dielectric layer 140 deposited over sidewalls of the plurality of second trenches 135. In some embodiments, the gate material 145 is deposited over the workpiece 100 to fill in the vertical openings in the plurality of second trenches 135 that is not completely filled by the dielectric layer 140. In some implementations, the gate material 145 may be polycrystalline silicon heavily doped with a P-type dopant (such as boron) or an N-type dopant (such as phosphorous) or a metal, such as tungsten, cobalt, nickel, copper, titanium nitride, tantalum nitride, ruthenium, or the like. In some embodiments, after the dielectric layer 140 and the gate material 145 are deposited at blocks 212 and 214, a planarization process, such as a CMP process, may be performed to provide a planar top surface for upcoming processes.

Figure 10B:
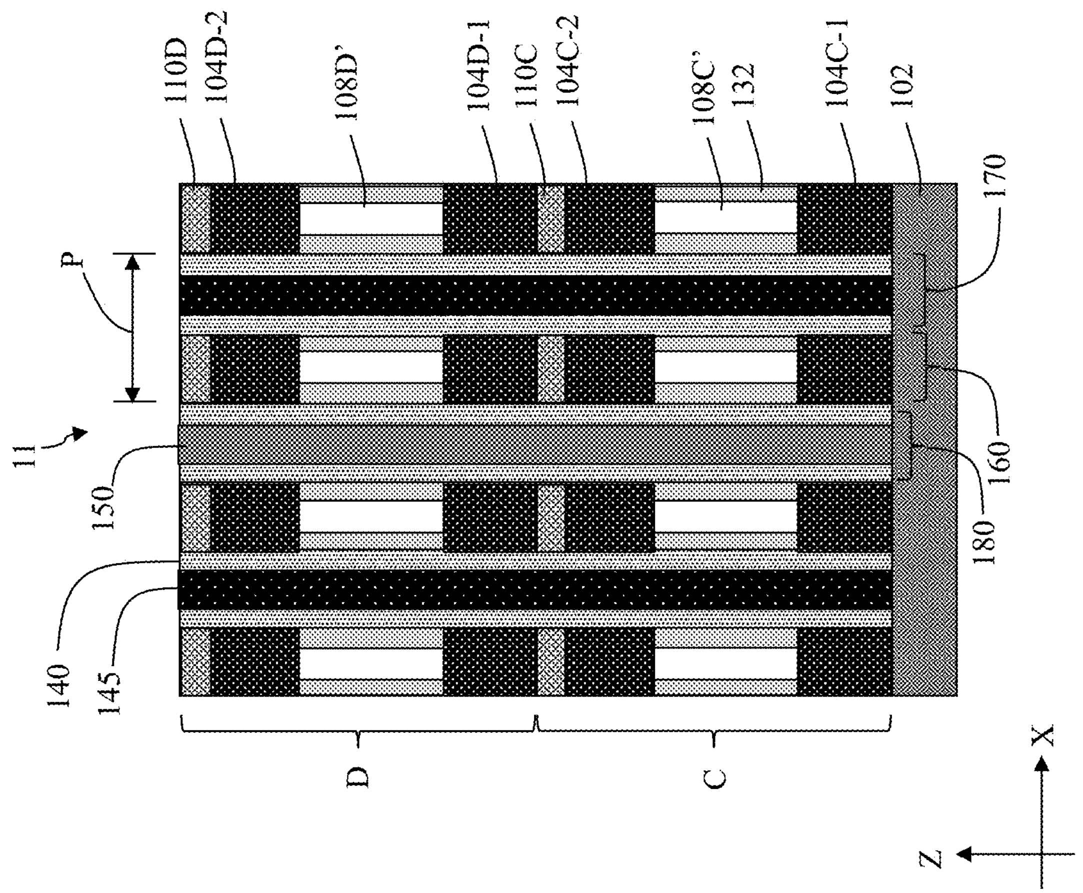
Figure 10A:
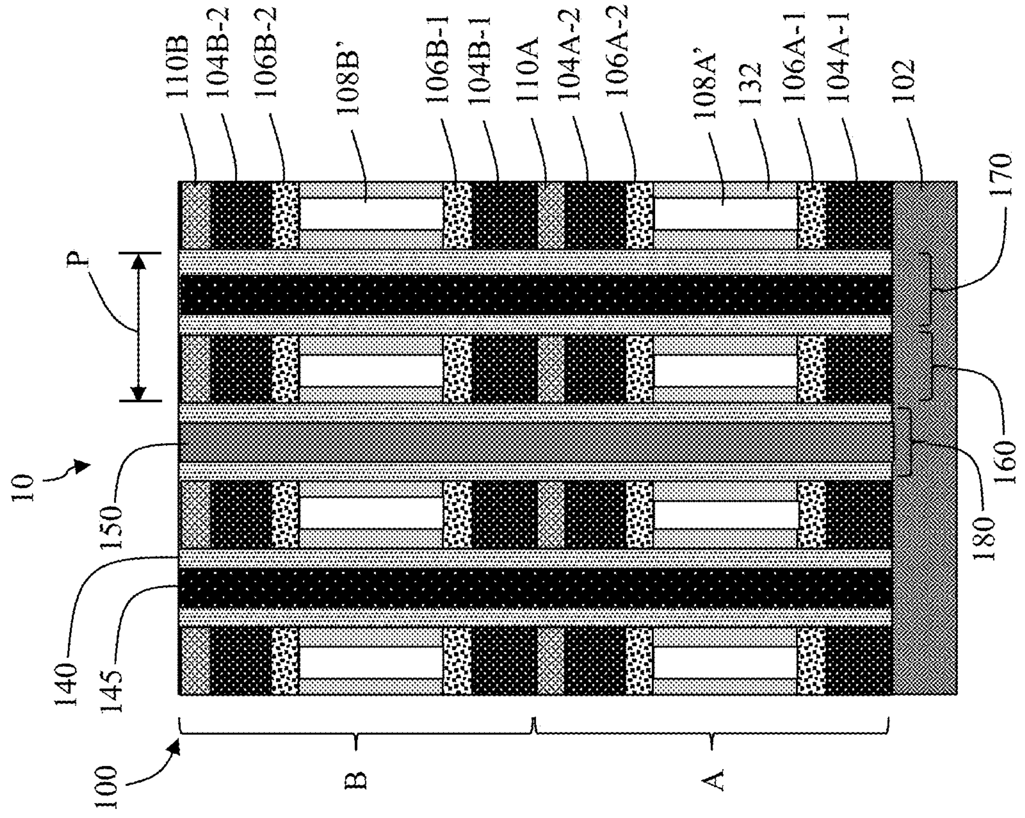

Referring now to FIGS. 3, 10A and 10B, the method 200 includes a block 216 where a plurality of vertical isolation features 150 are formed. In some embodiments, photolithography techniques may be used to form a plurality of holes in gate material 145 deposited in at least one of the plurality of second trenches 135. In some instances, the plurality of holes may expose the bottom dielectric layer 102 and separate the gate material 145 into multiple segments. FIGS. 10A and 10B represent a cross section that cut through one of the plurality of vertical isolation features 150. In those embodiments, a photoresist layer may be deposited over the workpiece 100 in a blanket manner. The photoresist layer may then be exposed to radiation reflected off or through a mask. The exposed photoresist layer may be baked in a post-bake process to undergo a chemical change to allow selective removal of the exposed/unexposed photoresist layer in a developing process. At this point, the photoresist layer is patterned. The gate material 145 deposited in at least one of the plurality of second trenches 135 is etched using a patterned photoresist layer as an etch mask to form the plurality of holes. Thereafter, an insulating material may be deposited over the workpiece 100 using CVD, PVD, ALD, or other suitable deposition techniques, to fill in the plurality of holes through gate material 145, so as to form the vertical isolation features 150. In some embodiments, the insulating material may include a dielectric material, such as a low-k dielectric material. In some instances, the insulating material may include silicon, oxygen, nitrogen, and carbon. In some examples, the insulating material may be silicon oxide, silicon oxy-carbonitride, silicon carbonitride, or silicon oxy-carbide. While not separately identified as another block in the method 200, the method 200 may include a planarization process, such as a CMP process, to planarize the top surface of the stack structure 10 in FIG. 10A and the alternative stack structure 11 in FIG. 10B.

Referring now to FIG. 3, the method 200 includes a block 218 where further processes are performed. For example, contact vias may be formed over the stack structure 10 or the alternative stack structure 11. For another example, an interconnect structure may be formed over the stack structure 10 or the alternative stack structure 11 to electrically couple to the stack structure 10 or the alternative stack structure 11 via the contact vias. For yet another example, an additional stack structure may be formed over the stack structure 10 or the alternative stack structure 11 to form a memory device of a greater capacity.

The stack structure 10 and the alternative stack structure 11 are free of tungsten, barrier layers, and protection layers common found in the convention stack structures. As shown in FIGS. 10A, the channel feature 132 extends between two polycrystalline semiconductor layers, such as the first and second polycrystalline semiconductor layers 106A-1 and 106A-2 or the third and fourth polycrystalline semiconductor layers 106B-1 and 106B-2. In addition, sidewalls of the channel feature 132 in the stack structure 10 are in direct contact with the dielectric layer 140 without any protection layers coming in between. Each of the first, second, third, and fourth silicide layers 104A-1, 104A-2, 104B-1, and 104B-2 is in direct contact with an isolation layer (such as the first isolation layer 110A or the second isolation layer 110B) and is in direct contact with a polycrystalline semiconductor layer (such as the first, second, third, and fourth polycrystalline semiconductor layers 106A-1, 106A-2, 106B-1, and 106B-2) without any barrier layer coming in between. Moreover, the first silicide layer 104A-1 in the stack structure 10 is in direct contact with the bottom dielectric layer 102.

Turning to the alternative stack structure 11 in FIG. 10B, the channel feature 132 extends between two silicide layers, such as the fifth and sixth silicide layers 104C-1 and 106C-2 or the seventh and eighth silicide layers 104D-1 and 104D-2. In addition, sidewalls of the channel feature 132 in the alternative stack structure 11 are in direct contact with the dielectric layer 140 without any protection layers coming in between. Each of the fifth, sixth, seventh, and eighth silicide layers 104C-1, 104C-2, 104D-1, and 104D-2 is in direct contact with an isolation layer (such as the third isolation layer 110C or the fourth isolation layer 110D) and is in direct contact with the recessed oxide layers (such as the third and fourth recessed oxide layers 108C' and 108D') without any barrier layer coming in between. Moreover, the fifth silicide layer 104C-1 in the alternative stack structure 11 is in direct contact with the bottom dielectric layer 102.

Each of the stack structure 10 in FIG. 10A and the alternative stack structure 11 in FIG. 10B has a plurality of channel columns 160 and a plurality of gate columns 170. Each of the plurality of gate columns 170 includes the dielectric layer 140 and the gate material 145. Each of the plurality of channel columns 160 includes the carved film stacks sandwiched between two gate columns 170 or between gate columns 170 and an isolation column 180. In some embodiments, the plurality of channel columns 160 includes a pitch P along X direction between about 80 nm and about 160 nm. In some instances, the width of the channel column 160 along X direction accounts for one half of the pitch P and the width of the gate column 170 (or the width of the isolation structure 180) along X direction accounts for the other half. That is, in these instances, each of the channel columns 160 has a width between about 40 nm and about 80 nm; each of the gate columns 170 has a width between about 40 nm and about 80 nm; and each of the isolation columns 180 has a width between about 40 nm and about 80 nm. In some examples, the dielectric layer 140 has a thickness along X direction between about 10 nm and 15 nm and the gate material 145 (or the vertical isolation feature 150) has a width along X direction between about 10 nm and 60 nm.

Accordingly, in one embodiment, the present disclosure provides a structure. The structure includes a bottom dielectric layer, a gate structure extending vertically from the bottom dielectric layer along a first direction, a stack structure, and a dielectric layer extending along the first direction between the gate structure and the stack structure. The stack structure includes a plurality of memory film stacks. Each of the plurality of memory film stacks includes a first silicide layer, a second silicide layer, an oxide layer extending between the first and second silicide layers along the first direction, a channel region over the oxide layer and extending between the first and second silicide layers along the first direction, an isolation layer over the second silicide layer along the first direction.

In some embodiments, the first and second silicide layers include titanium, tungsten, palladium, or cobalt. In some implementations, the stack structure is free of metal nitride that is in direct contact with the first silicide layer or the second silicide layer. In some instances, the isolation layer and the bottom dielectric layer have different compositions. In some implementations, the isolation layer comprises silicon nitride. In some embodiments, the first silicide layer and the second silicide layer are in direct contact with the dielectric layer. In some implementations, the structure may further include a first polycrystalline semiconductor layer between the first silicide layer and the oxide layer, and a second polycrystalline semiconductor layer between the second silicide layer and the oxide layer.

In another embodiment, a memory device is provided. The memory device includes a bottom dielectric layer, a gate structure extending vertically from the bottom dielectric layer along a first direction, a stack structure, and a dielectric layer extending along the first direction between the gate structure and the stack structure. The stack structure includes a first silicide layer, a second silicide layer, an oxide layer extending between the first and second silicide layers along the first direction, a channel region over the oxide layer and extending between the first and second silicide layers along the first direction, and an isolation layer over the second silicide layer. The first and second silicide layers include cobalt, titanium, tungsten, or palladium.

In some embodiments, the isolation layer is formed of silicon nitride and the bottom dielectric layer is formed of aluminum oxide or aluminum nitride. In some implementations, the stack structure is free of a metal nitride layer between the first silicide layer and the oxide layer and between the second silicide layer and the oxide layer. In some implementations, the memory device may further include a first polycrystalline silicon layer between the first silicide layer and the oxide layer, and a second polycrystalline silicon layer between the second silicide layer and the oxide layer. In some embodiments, the first silicide layer and the second silicide layer are in direct contact with the dielectric layer.

In yet another embodiment, a method of fabricating a semiconductor device is provided. The method includes forming a stack structure on a bottom dielectric layer by performing a plurality of film stacking cycles. Each of the plurality of film stacking cycles includes depositing a first silicide layer, depositing an oxide layer over the first silicide layer, depositing a second silicide layer over the oxide layer, and depositing an isolation layer over the second silicide layer. The method further includes forming a plurality of first trenches through the stack structure to expose the oxide layer and the bottom dielectric layer; etching the oxide layer exposed in the plurality of first trenches to form a recess; depositing a semiconductor material in the plurality of first trenches; recessing the semiconductor material to form a plurality of second trenches through the stack structure such that a portion of the semiconductor material remains deposited in the recess; depositing a dielectric layer over sidewalls in the pluralities of second trenches; and depositing a conductive material over the dielectric layer in the plurality of second trenches.

In some embodiments, the depositing of the dielectric layer includes depositing the dielectric layer using low-pressure chemical vapor deposition (LPCVD) or low-pressure atomic layer deposition (LPALD). In some implementations, the first and second silicide layers comprise titanium, cobalt, tungsten, or palladium. In some instances, each of the plurality of film stacking cycles further includes depositing a first polycrystalline semiconductor layer over the first silicide layer before depositing the oxide layer, and depositing a second polycrystalline semiconductor layer over the oxide layer before depositing the second silicide layer. In some embodiments, the isolation layer and the bottom dielectric layer have different compositions. In some implementations, the isolation layer includes silicon nitride. In some embodiments, the depositing of the dielectric layer includes depositing a first silicon oxide layer over the sidewalls in the plurality of second trenches, depositing a silicon nitride layer over the first silicon oxide layer, and depositing a second silicon oxide layer over the silicon nitride layer. In some embodiments, the method may further include forming a plurality of vertical isolation features to separate the conductive material into more than one segment.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure, comprising:

a bottom dielectric layer;

a vertical isolation structure extending from the bottom dielectric layer along a direction, a bottom surface of the vertical isolation structure interfacing a top surface of the bottom dielectric layer;

a stack structure disposed over the bottom dielectric layer and comprising:

a first silicide layer, a second silicide layer over the first silicide layer, an oxide layer extending between the first and second silicide layers along the direction, and a first channel feature extending along a first sidewall of the oxide layer and extending between the first and second silicide layers along the direction; and a first dielectric layer sandwiched between the vertical isolation structure and the stack structure, wherein the first channel feature interfaces the first sidewall of the oxide layer.

2. The device structure of claim 1, wherein the stack structure further comprises an isolation layer over the second silicide layer.

3. The device structure of claim 2, wherein a composition of the isolation layer is different from a composition of the bottom dielectric layer.

4. The device structure of claim 1, wherein the bottom dielectric layer comprises zirconium oxide, aluminum oxide, aluminum nitride, silicon carbide, or silicon nitride.

5. The device structure of claim 1, wherein the first silicide layer and the second silicide layer comprise titanium silicide, cobalt silicide, tungsten silicide, or palladium silicide.

6. The device structure of claim 1, further comprising:

a first polycrystalline semiconductor layer between the first silicide layer and the oxide layer along the direction; and a second polycrystalline semiconductor layer between the second silicide layer and the oxide layer along the direction.

7. The device structure of claim 6, wherein the first polycrystalline semiconductor layer and the second polycrystalline semiconductor layer comprise polycrystalline silicon.

8. The device structure of claim 1, further comprising:

a vertical gate structure adjacent the stack structure such that the stack structure is disposed between the vertical isolation structure and the vertical gate structure, wherein the vertical gate structure is spaced apart from the stack structure by a second dielectric layer.

9. The device structure of claim 8, wherein the stack structure further includes a second channel feature extending along a second sidewall of the oxide layer and extending between the first and second silicide layers along the direction, wherein the second sidewall is opposed to the first sidewall.

10. The device structure of claim 8, wherein the vertical gate structure comprises polycrystalline silicon heavily doped with a dopant, tungsten, cobalt, nickel, copper, titanium nitride, tantalum nitride, and ruthenium.

11. A structure, comprising:

a bottom dielectric layer;

a first stack structure and a second stack structure disposed over and interfacing a top surface of the bottom dielectric layer;

a gate structure disposed between a sidewall of the first stack structure and a sidewall of the second stack structure along a direction;

a first dielectric layer sandwiched between the gate structure and the first stack structure; and a second dielectric layer sandwiched between the gate structure and the second stack structure, wherein each of the first stack structure and the second stack structure comprises:

a first silicide layer, a second silicide layer over the first silicide layer, an oxide layer vertically extending between the first and second silicide layers, a first channel feature extending along a first sidewall of the oxide layer and extending vertically between the first and second silicide layers, and a second channel feature extending along a second sidewall of the oxide layer and extending vertically between the first and second silicide layers.

12. The structure of claim 11, wherein the first stack structure and the second stack structure are free of metal nitride.

13. The structure of claim 11, wherein the gate structure comprises polycrystalline silicon heavily doped with a dopant, tungsten, cobalt, nickel, copper, titanium nitride, tantalum nitride, and ruthenium.

14. The structure of claim 11, wherein the oxide layer is sandwiched between the first channel feature and the second channel feature along the direction.

15. The structure of claim 11, wherein the first channel feature and the second channel feature comprises a polycrystalline semiconductor material.

16. A structure, comprising:

a bottom dielectric layer;

a gate structure extending from the bottom dielectric layer along a direction;

a first stack structure disposed over and interfacing a top surface of the bottom dielectric layer;

an isolation layer over the first stack structure;

a second stack structure disposed over the isolation layer; and a dielectric layer extending from between the gate structure and the first stack structure to between the gate structure to the second stack structure, wherein each of the first stack structure and the second stack structure comprises:

a first silicide layer, a second silicide layer over the first silicide layer, an oxide layer vertically extending between the first and second silicide layers, a first channel feature extending along a first sidewall of the oxide layer and extending vertically between the first and second silicide layers, and a second channel feature extending along a second sidewall of the oxide layer and extending vertically between the first and second silicide layers.

17. The structure of claim 16, wherein the first stack structure and the second stack structure are free of metal nitride.

18. The structure of claim 16, wherein the gate structure comprises polycrystalline silicon heavily doped with a dopant, tungsten, cobalt, nickel, copper, titanium nitride, tantalum nitride, and ruthenium.

19. The structure of claim 16, wherein the first channel feature and the second channel feature comprises a polycrystalline semiconductor material.

20. The structure of claim 16, wherein the first silicide layer and the second silicide layer comprise titanium silicide, cobalt silicide, tungsten silicide, or palladium silicide.

* * * * *